US012254222B2

(12) United States Patent
Le Gallo-Bourdeau et al.

(10) Patent No.: US 12,254,222 B2
(45) Date of Patent: Mar. 18, 2025

(54) ACCURATE PROGRAMMING OF ANALOG MEMORY DEVICES OF IN-MEMORY PROCESSING DEVICES HAVING A CROSSBAR ARRAY STRUCTURE

(71) Applicant: International Business Machines Corporation, Armonk, NY (US)

(72) Inventors: Manuel Le Gallo-Bourdeau, Horgen (CH); Athanasios Vasilopoulos, Zurich (CH); Benedikt Kersting, Zurich (CH); Julian Röttger Büchel, Zurich (CH); Abu Sebastian, Adliswil (CH)

(73) Assignee: International Business Machines Corporation, Armonk, NY (US)

( * ) Notice: Subject to any disclaimer, the term of this patent is extended or adjusted under 35 U.S.C. 154(b) by 206 days.

(21) Appl. No.: 18/305,466

(22) Filed: Apr. 24, 2023

(65) Prior Publication Data

US 2024/0160348 A1    May 16, 2024

(30) Foreign Application Priority Data

Nov. 14, 2022   (GR) .............................. 20220100941

(51) Int. Cl.
    *G11C 11/00* (2006.01)
    *G06F 3/06* (2006.01)
    *G11C 11/56* (2006.01)

(52) U.S. Cl.
    CPC ............ *G06F 3/0679* (2013.01); *G11C 11/56* (2013.01)

(58) Field of Classification Search
    CPC ... G11C 13/0069; G11C 11/54; G11C 7/1006; G11C 13/004; G11C 2213/77;
    (Continued)

(56) References Cited

U.S. PATENT DOCUMENTS 10,635,398 B2   4/2020   Lin et al.
10,754,921 B2   8/2020   Khaddam-Aljameh
(Continued)

FOREIGN PATENT DOCUMENTS

WO   2014/085975 A1   6/2014

OTHER PUBLICATIONS

Vasilopoulos et al., "Exploiting the State Dependency of Conductance Variations in Memristive Devices for Accurate In-Memory Computing," IEEE Transactions on Electron Devices, vol. 70, Issue: 12, Dec. 2023, pp. 6279-6285.
(Continued)

*Primary Examiner* — Thong Q Le
(74) *Attorney, Agent, or Firm* — Kelsey M. Skodje (57) ABSTRACT

The invention is notably directed to a method of programming memory elements of an in-memory computing (IMC) device. The IMC applies a SET signal to the K memory elements of said each cell to set each of the K memory elements to a SET state and reading K conductance values of the K memory elements in the SET state. The IMC adjusts, based on the K conductance values read and the target conductance value, a conductance value of at least one of the K memory elements to match a summed conductance of the K memory elements of said each cell with the target conductance value. The IMC maximizes a number of the K memory elements that are either in their SET state or in a RESET state of zero conductance nominal value, such that at most one of the K memory elements is neither in a SET state nor in a RESET state.

25 Claims, 5 Drawing Sheets

(58) Field of Classification Search
CPC .............. G11C 13/0007; G11C 13/003; G11C 13/0026; G11C 13/0028; G11C 13/0033; G11C 2213/71; G11C 5/025; G11C 5/063; G11C 7/18; G11C 8/10; G11C 8/12; G11C 8/14; G11C 11/40; G11C 11/56; G11C 11/5678; G11C 13/0004; G11C 13/0064; G11C 29/028; G11C 16/26; G11C 16/3418; G11C 2013/0057; G11C 7/00; G11C 7/1063; G11C 7/1069; G06F 7/5443; G06F 17/16; G06F 2207/4824; G06F 7/523; G06F 2207/4814; G06F 2207/4828; G06F 3/0679; G06F 16/90335; G06F 16/906; G06F 17/12; G06F 7/50; G06F 12/0207; G06F 12/0238; G06F 17/18; G06F 2207/4802; G06F 2212/202; G06F 3/0604; G06F 3/0655; G06F 9/30036; G06F 9/345

See application file for complete search history.

(56) References Cited

U.S. PATENT DOCUMENTS

| | | |
|---|---|---|
| 11,188,825 B2 | 11/2021 | Boybat Kara et al. |
| 11,335,387 B2 | 5/2022 | Shan et al. |
| 11,373,092 B2 | 6/2022 | Piveteau et al. |
| 2015/0310311 A1 | 10/2015 | Shi et al. |
| 2020/0192970 A1 | 6/2020 | Ma |
| 2020/0226200 A1 | 7/2020 | Khaddam-Aljameh |
| 2021/0271597 A1 | 9/2021 | Verma et al. |
| 2024/0161792 A1* | 5/2024 | Mackin ................ G11C 13/004 |

OTHER PUBLICATIONS

"Patent Cooperation Treaty PCT Written Opinion of the International Searching Authority", Applicant's file reference PCT/ISA/220, International application No. PCT/IB2023/060885, International filing date Oct. 29, 2023, Date of mailing Jan. 19, 2024, 10 pages.

Buchel et al., "Gradient descent-based programming of analog in-memory computing cores", 2022 International Electron Devices Meeting (IEDM), IEEE, Jan. 23, 2024, pp. 4.

Khaddam-Aljameh et al., "HERMES-Core-A 1.59-TOPS/mm 2 PCM on 14-nm CMOS In-Memory Compute Core Using 300-ps/LSB Linearized CCO-Based ADCs", IEEE Journal of Solid-State Circuits, vol. 57, No. 4, Apr. 2022, 12 pages.

Le Gallo et al., "A 64-core mixed-signal in-memory compute chip based on phase-change memory for deep neural network inference", arXiv:2212.02872v1 [cs.ET] Dec. 6, 2022, 25 pages.

Boybat et al., "Neuromorphic computing with multi-memristive synapses", Nature Communications | (2018) | DOI: 10.1038/s41467-018-04933-y, 13 pages.

Khaddam-Aljameh et al., "A Multi-Memristive Unit-Cell Array With Diagonal Interconnects for In-Memory Computing", IEEE Transactions on Circuits and Systems—II: Express Briefs, vol. 68, No. 12, Dec. 2021, 5 pages.

Kim et al., "Efficient precise weight tuning protocol considering variation of the synaptic devices and target accuracy", Neurocomputing 378 (2020), Elsevier, 8 pages.

Le Gallo et al., "Precision of bit slicing with in-memory computing based on analog phase-change memory crossbars", Neuromorph. Comput. Eng. 2 (2022) 014009, 15 pages.

Le Gallo-Bourdeau et al., "Accurate Programming of Analog Memory Devices of In-Memory Processing Devices Having a Crossbar Array Structure", Greece Application No. 20220100941, IBM Docket No. P202202242GR01, Filed Nov. 14, 2022, 41 pages.

Mackin et al., "Weight Programming in DNN Analog Hardware Accelerators in the Presence of NVM Variability", Advanced Electronics Materials, Full Paper, Memory Devices, Adv. Electron. Mater, 2019, © 2019 WILEY-VCH Verlag Gmbh & Co. KGaA, Weinheim, 12 pages.

Martemucci et al., "Accurate weight mapping in a multi-memristive synaptic unit", ISCAS 2021, IEEE, 5 pages, <https://ieeexplore.ieee.org/abstract/document/9401558>.

Narayanan et al., "Circuit Techniques for Efficient Acceleration of Deep Neural Network Inference with Analog-AI (Invited)", 2021 IEEE International Symposium on Circuits and Systems (ISCAS), 5 pages.

* cited by examiner

ACCURATE PROGRAMMING OF ANALOG MEMORY DEVICES OF IN-MEMORY PROCESSING DEVICES HAVING A CROSSBAR ARRAY STRUCTURE

BACKGROUND OF THE INVENTION

The invention relates in general to methods of programming analog memory elements of in-memory computing devices having a crossbar array structure, programmable systems equipped with such in-memory computing devices, and related computer program products. In particular, it is directed to a programming method that maximizes a number of memory elements that are either in a SET state or in a RESET state.

Artificial neural networks (ANNs) such as deep neural networks have transformed the field of machine learning by providing unprecedented performance in solving cognitive tasks. ANN operations typically involve matrix-vector multiplications (MVMs). Such operations pose multiple challenges, because of their recurrence, as well as compute and memory requirements. Traditional computer architectures are based on the von Neumann computing concept, according to which processing capability and data storage are split into separate physical units. This architectural concept suffers from congestion and high-power consumption, as data must be continuously transferred from the memory units to the control and arithmetic units through interfaces that are physically constrained and costly.

SUMMARY

According to a first aspect, the present invention is embodied as a method of programming memory elements of an in-memory computing (IMC) device that has a crossbar array structure. That is, the IMC device includes N input lines and M output lines, which are interconnected at cross-points (i.e., junctions) defining N×M cells, where N≥2 and M≥2. The cross-points comprise respective memory systems, which connect the input lines to the output lines. Each memory system includes a group of K memory elements arranged in parallel, where K≥2. That is, each cell of the N×M cells includes K memory elements.

The aim of the method is to program each cell, given a target conductance value corresponding to a target weight value to be stored in said each cell. Each cell is programmed by first setting the K memory elements to a SET state. To that aim, a SET signal is applied to the K memory elements of each cell. The K conductance values of the K memory elements (now in a SET state) are subsequently read, with a view to adjusting the electrical conductance of the cell. I.e., the conductance value of at least one of the K memory elements is adjusted based on the K conductance values read and the target conductance value. This is performed so as to match a summed conductance of the K memory elements of the cell with the target conductance value, while maximizing a number of the K memory elements that are either in their SET state or in a RESET state of zero conductance nominal value, such that at most one of the K memory elements is neither in a SET state nor in a RESET state.

This makes it possible to reduce inaccuracies due to intermediate conductance states across the array. This, in turn, leads to significant reduction in programming errors and increases the computational precision.

Preferred embodiments rely on the determination of a suitable subset of memory elements. That is, the adjustment procedure first comprises determining a subset of K' memory elements, where K'≤K, based on the K conductance values read and the target conductance value. The latter is typically obtained by scaling an initial conductance value, i.e., by multiplying an initial weight value by a scaling factor, which is determined in accordance with a maximum cell conductance of the cell.

The above subset is determined under the constraint that the summed conductance of the memory elements of this subset must match the target conductance value, subject to a tolerance that can be removed by reprogramming at most one of the K' memory elements. Next, the adjustment per se is achieved by: (i) applying a RESET signal to any remaining memory element (of the cell) that is not in the subset, to set such an element to its RESET state; and/or (ii) reprogramming at most one of the K' memory elements of the determined subset.

The above subset may for instance be determined as a subset of smallest cardinality, i.e., a subset for which the summed conductance values of the memory elements in their SET state is the largest. In addition, the memory element to be reprogrammed may advantageously be selected as the element having the smallest conductance among the memory elements of the determined subset, so as to minimize the number of memory elements in an intermediate state.

Some scenarios will merely require reprogramming exactly one of the K' memory elements, while others may solely require resetting the remaining memory elements, i.e., elements that are outside the determined subset. However, most likely scenarios are those requiring to both apply the RESET signal to any remaining memory element and reprogram exactly one of the K' memory elements.

The proposed approach can advantageously be applied to multi-device cells in a differential configuration. That is, the memory system of each cell may include two groups of K memory elements, where K≥2 in each group (each cell now includes 2 K memory elements). The two groups are in a differential configuration; they consist of a first group of K memory elements and a second group of K memory elements, which are respectively meant to store a positive weight value and a negative weight value. The K memory elements are arranged in parallel in each of the two groups.

In such a context, the method further comprises selecting a given group of the two groups in accordance with an intended sign of the target weight to be stored in each cell. This is done prior to, and with a view to, setting the memory elements in their SET state. The SET signal need only be applied to the K memory elements of the given group selected, which results in setting each of the K memory elements of the given group to the SET state. However, 2 K conductance values are subsequently read, which consist of the K conductance values of the K memory elements in each of the two groups. Eventually, the adjustment procedure is performed by modifying one or more conductance values in the given group. That is, the method will adjust a conductance value of at least one of the K memory elements of the given group, based on the 2 K conductance values read and the target conductance value. The aim is to match the summed conductance of the 2 K memory elements of the cell with the target conductance value, while maximizing the number of the 2 K memory elements that are either in their SET state or in a RESET state of zero conductance nominal value, such that at most one of the K memory elements of the given group is neither in a SET state nor in a RESET state.

Note, the conductance of the at most one of the memory elements can notably be adjusted in accordance with any suitable single-device programming method, such as an iterative programming method, a gradient-based algorithm, or a single shot programming method. Preferably, the K memory elements are initially set to the SET state by programming the K memory elements according to a single shot programming method. Similarly, the remaining memory elements, if any, are preferably reset to the RESET state by programming such memory elements according to a single shot programming method. For completeness, each cell is typically initialized by resetting all of its memory elements, prior to applying the SET signal to the K memory element of the cell or a group of K memory elements, the group selected in accordance with its polarity.

According to another aspect, the invention is embodied as a processing system. The system includes an IMC device having a crossbar array structure, as described above. The memory elements are analog memory devices, such as phase-change memory devices, resistive random-access memory devices, and flash memory cell devices. Preferably, the memory elements are phase-change memory devices. The system is further equipped with a programming unit that is connected to the IMC device. The programming unit is configured to program each cell in accordance with the above methods, i.e., by setting the K memory elements of each cell to a SET state and then adjusting a conductance value of at least one of the K memory elements. Again, the aim is to match a summed conductance of the K memory elements of said each cell with the target conductance value, while maximizing a number of the K memory elements that are either in their SET state or in a RESET state, such that at most one of the K memory elements is in an intermediate state (i.e., neither in a SET state nor in a RESET state).

Preferably, the programming unit is connected to the IMC device, via the input lines or the output lines of the IMC device, and is adapted to adjust the conductance value of said at least one of the K memory elements by applying voltage signals across the input lines or the output lines, respectively. In variants, the programming unit may also be connected to the IMC device via further lines, independently from the input lines or the output lines.

In embodiments, the processing system further includes a readout circuit connected in output of the output lines. The programming unit may for instance be connected to the readout circuit and configured to adjust said conductance value in accordance with a single-device programming method.

Again, each memory system may possibly include two groups of K memory elements, in a differential configuration. In that case, the programming unit will further be configured to select a given group of the two groups, in accordance with an intended sign of the target weight to be stored in the cell.

A final, yet related, aspect of the invention concerns a computer program product for programming memory elements of an IMC device as described above. The program instructions executable by processing means of a programming unit, which can be connected to the IMC device, to cause the programming unit to program each cell of the IMC device in accordance with a method as described above.

BRIEF DESCRIPTION OF THE SEVERAL VIEWS OF THE DRAWINGS

These and other objects, features and advantages of the present invention will become apparent from the following detailed description of illustrative embodiments thereof, which is to be read in connection with the accompanying drawings. The illustrations are for clarity in facilitating one skilled in the art in understanding the invention in conjunction with the detailed description. In the drawings:

FIGS. 3B-3D compare distributions of conductance values that would typically be obtained across a cell of 2×2 memory elements by different methods, including prior art methods (FIGS. 3B, 3C) and a method according to embodiments (FIG. 3C). In detail, FIGS. 3B and 3C show conductance values obtained according to an equal-fill approach and a max-fill approach (not according to embodiments), while FIG. 3D shows conductance values obtained in accordance with an embodiment. The conductance values obtained in FIG. 3D maximize the number of devices that are either in a SET or RESET state; only a single device is in an intermediate state;

FIGS. 6A and 6B are diagrams illustrating single-device programming schemes that can be used in embodiments. FIG. 6A assumes the use of a gradient-based programming method, whereas FIG. 6B relies on an iterative programming scheme.

The accompanying drawings show simplified representations of devices or parts thereof, as involved in embodiments. Similar or functionally similar elements in the figures have been allocated the same numeral references, unless otherwise indicated.

Methods, systems, and computer program products, embodying the present invention will now be described, by way of non-limiting examples.

DETAILED DESCRIPTION

One possibility to accelerate MVMs is to use dedicated hardware acceleration devices, such as in-memory computing devices having a crossbar array structure. This type of circuit includes input lines and output lines, which are interconnected at cross-points defining cells. The cells contain respective memory elements (or sets of memory elements), which are designed to store respective matrix coefficients. Such an architecture can simply and efficiently map MVMs: Vectors are encoded in signals, which are applied to the input lines of the crossbar array to perform the MVMs as multiply-accumulate (MAC) operations. The weights can be updated by reprogramming the memory elements, as needed to perform the successive MVMs. Such in-memory computing devices break the "memory wall" as they fuse the arithmetic- and memory unit into a single in-memory-computing (IMC) unit.

What is more, using analog memory devices in an IMC unit allows MVM operations to be efficiently performed, by exploiting analog storage capability of the IMC device and Kirchhoff's circuits laws. Another advantage of crossbar array structures is that they support transposed matrix operations, something that can be exploited to train ANNs. More generally, the key compute primitive enabled by such devices can also be used for other applications, e.g., solvers for systems of linear equations.

However, a key challenge is to achieve a satisfactory computational accuracy, which is essentially determined by the accuracy with which target synaptic conductance values can be mapped onto the synaptic elements, i.e., the analog memory elements.

Consider for instance a synaptic weight to be stored in a unit cell with two memristive devices in a differential configuration. I.e., the memristive devices are respectively meant to store a positive and a negative value. In such a configuration, the target weight value is typically mapped onto the conductance of one memristive device only, either the "positive" device (set to have a conductance value $G_p$) or the "negative" device (set to have a conductance value $G_n$), depending on the sign of the weight value. The other device is reset to a RESET state having a zero nominal conductance value. The target weight is typically scaled by a factor (call it $G_{max}$), to transform it to a value, such that the entire dynamic range of device conductance is exploited across memory elements of the cells.

The same approach can be extended to unit cells including two groups of K devices each, where the two groups are in a differential configuration, while the K devices are connected in parallel in each group. Here, the value of the weight is mapped on the conductance of the K devices of a group selected in accordance with its polarity. The mapping can be done in multiple ways. One approach (referred to as the "equal-fill approach") is to scale the weight with an arbitrarily chosen factor ($G_{max}$), as in the single device approach, and map all K devices to that value. Another approach (often referred to as the "max-fill approach") is to scale the weight by a factor equal to $K \times G_{max}$, and map as many memory devices as possible to the value $G_{max}$, while setting a single device to a conductance value corresponding to the residual difference. The remaining devices, if any, are reset to a zero conductance.

The most common approach to program a weight in a single device is the so-called "iterative programming" (ITP) scheme, whereby the memory devices are individually read, and a corrective pulse is applied to such devices to minimize the difference between the target conductance value ($G_{target}$) and the measured value ($G_{measured}$). The corrective pulses applied are iteratively defined by a programming controller. A main drawback of this approach is that single-device readouts can be inaccurate and expensive to implement, because of the high-resolution analog-digital converters (ADCs) and the fairly long integration times needed.

Another common single-device programming approach is the so-called "single shot programming" (SSP) approach, where programming pulses are parametrically captured in a lookup table (LUT), which gathers all information related to the programming curves. A main drawback of this approach is that the ideal programming curves have an inter- and intra-device variability (except for setting the memory devices to their SET and RESET states). As a result, intermediate states cannot be reached accurately in large arrays of memory devices.

When it comes to multi-device unit cells, the programming can be done by extending or combining the above single-device programming schemes. For example, one may extend the ITP approach to all the memory devices involved in a unit cell and individually loop over each device. Another possibility is to combine the SSP and ITP approaches, whereby the memory devices can be initialized using an SSP approach by applying RESET and SET pulses. A sequential read-verify scheme can be subsequently used to program the memory devices initially set to a RESET state either in a SET state, a RESET state, or an intermediate state, by applying SSP pulses. The aim is to bring the summed conductance value ($G_{cell}$) of the memory elements in the cell as close as possible to $G_{target}$. Eventually, the ITP scheme can be used to program the memory devices that were initially set to a SET state to correct for the SSP programming errors and minimize the residual conductance error ($G_{error}$) of the SSP scheme.

As the present inventors, known programming schemes inherently result in some inaccuracy in the programmed weight values. They accordingly came to devise novel techniques to program analog memory elements of crossbar arrays more accurately.

As the present inventors observed, there is a fairly wide distribution of actual conductance values corresponding to SET states of analog memory elements in an in-memory computing (IMC) device having a crossbar array structure. The RESET state of analog memory elements is effectively nonconductive, such that noise and drift have a marginal impact on the computational accuracy. Still, the SET states of analog memory elements happen to be less "noisy" than intermediate states, even though they have a larger conductance value. That intermediate states are noisy means that their actual conductance values, once programmed, measurably depart from their intended values, which results in some noise across the array. Discrepancies between actual conductance values and intended conductance values may result from drift or programming inaccuracies.

Now, in prior programming schemes, the scale factor $G_{max}$ used to form the conductance values is assumed to be the same for all the memory devices of the array; it is further defined in such a way that most of the SET conductance values are actually larger than the $G_{max}$ value. Practically, this means that it is not possible to program most of the memory devices to their SET states.

As the present inventors have realized, programming the devices to their $G_{set}$ value instead of their $G_{max}$ value leads to a significant reduction in programming errors and an increase in computational precision. They accordingly came to devise novel techniques to program analog memory elements of crossbar array devices, which maximize the number of the K memory elements that are either in a SET state or in a RESET state, subject to at most one memory element that is programmed to an intermediate state, as necessary for the cell to match a target conductance value corresponding to a target weight value.

The following description is structured as follows. General embodiments and high-level variants are described in section 1. Section 2 discusses particularly preferred embodiments. Section 3 addresses technical implementation details. Note, the present method and its variants are collectively referred to as "the present methods". All references Sn refer to methods steps of the flowcharts of FIG. 5, while numeral references pertain to devices, components, and concepts involved in embodiments of the present invention.

1. General Embodiments and High-Level Variants

Figure 1:
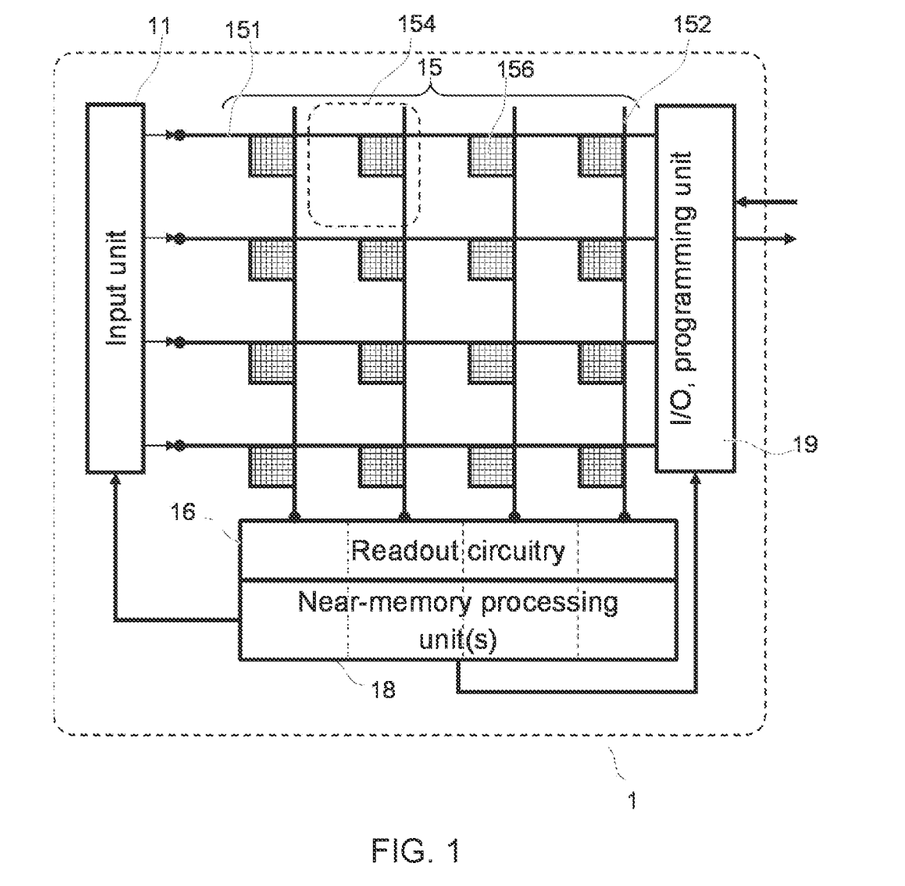
FIG. 1 schematically represents selected components of a hardware system, which notably includes an in-memory computing device having a crossbar array structure, as well as a programming unit to program memory elements of the -memory computing device, according to embodiments.
Figure 2:
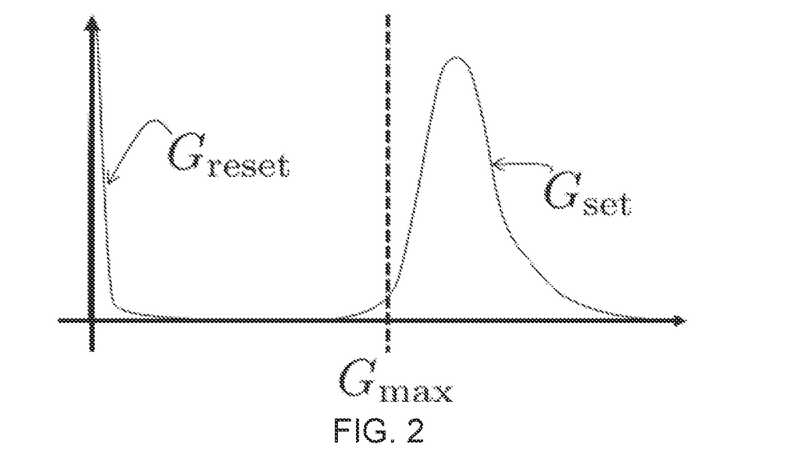
FIG. 2 is a plot that schematically represent the distributions of actual conductance values of resistive memory devices of crossbar array structure, whether in their SET state or in their RESET state.
Figure 5:
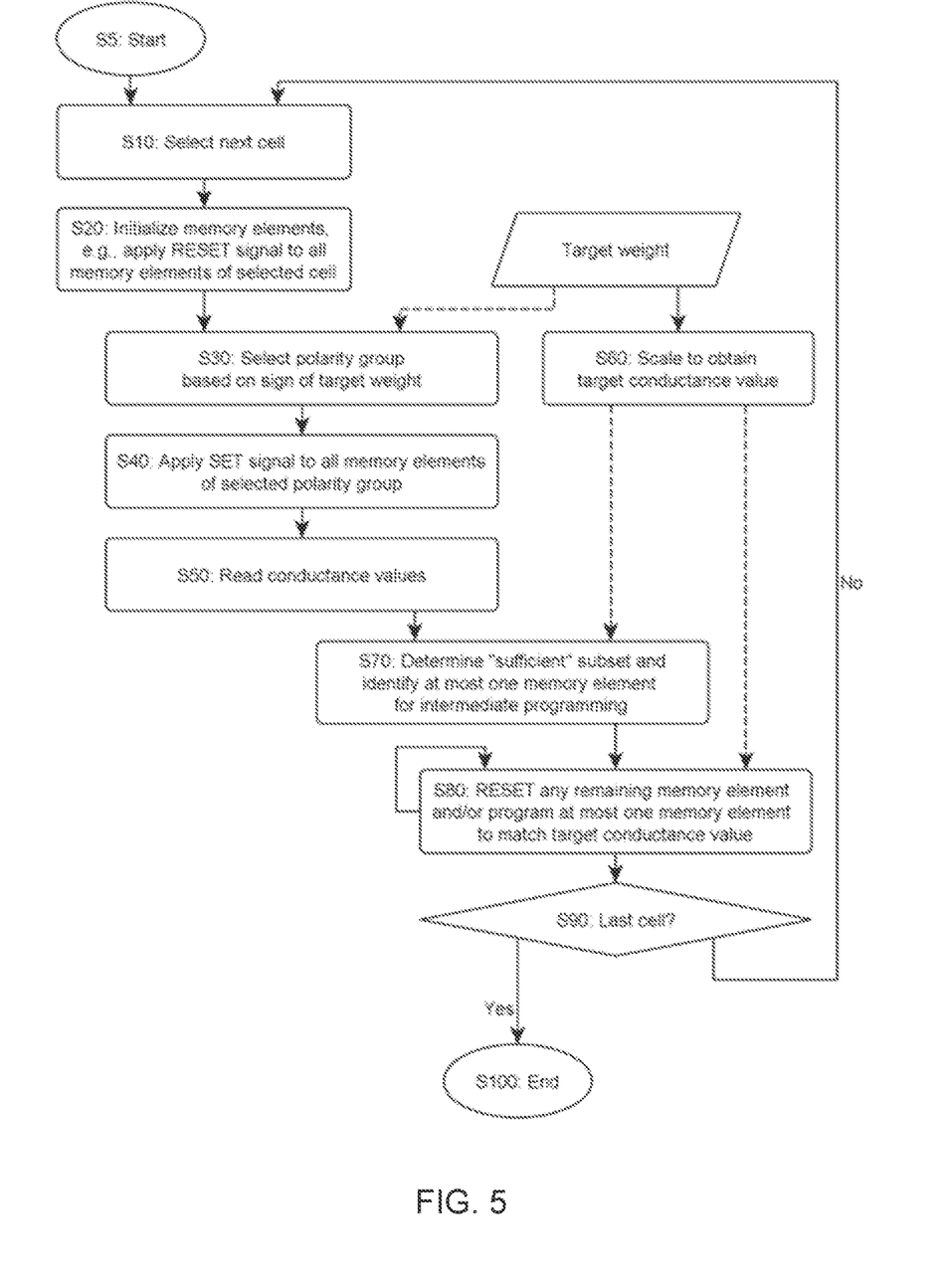
FIG. 5 is a flowchart illustrating high-level steps of a method of programming memory elements of an in-memory computing device having a crossbar array structure, according to embodiments.

A first aspect of the invention is now described in detail, mainly in reference to FIGS. 1 and 5. This aspect concerns a method of programming analog memory elements 157 of an IMC device 15 that has a crossbar array structure, as illustrated in FIG. 1.

That is, the IMC device 15 includes N input lines 151 and M output lines 152, which lines are interconnected at cross-points (i.e., junctions). The cross-points accordingly define N×M cells 154, also called unit cells. The input and output lines are interconnected via memory systems 156. In principle, at least two input lines and two output lines are needed to define an array (i.e., N≥2 and M≥2). In practice, however, the number of input lines 151 and output lines 152 will typically be on the order of several hundreds to thousands of lines. For example, arrays of 256×256, 512×512, or 1024×1024 may be contemplated, although N need not be necessarily equal to M. The IMC device 15 may for instance be meant to be used as a neural processing apparatus, designed to implement M neurons at a time. The number of neurons may thus be equal to 256, 512, or 1024, for example.

Figure 3A:
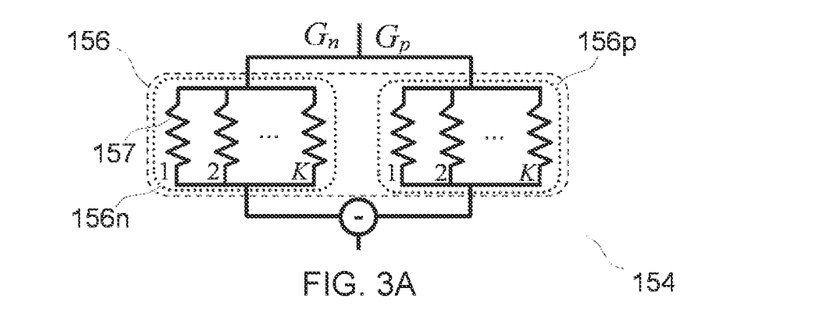
FIGS. 3A-3D depict unit cells of crossbar array structure, as involved in embodiments. In each case, the cell includes two polarity groups in a differential configuration, where the K resistive memory elements are arranged in parallel in each group, see FIG. 3A.

Examples of unit cells are shown in FIGS. 3A-4 E. As schematically shown in FIG. 1, the cross-points comprise respective memory systems 156. As seen in FIGS. 3A-4E, each memory system 156 includes a group of K memory elements 157, which are arranged in parallel in this group. In fact, each cell may contain two groups of K memory elements 157 each, for reasons that will become apparent later. Various connection schemes can be contemplated. Preferably, each input (respectively output) line typically subdivides into K or 2 K conductors, so as to adequately connect to (respectively from) respective memory elements of each cell. So, each input (or output) line typically includes several, parallel electrical conductors. For now, assume that each cell contains a group of K memory elements, such that each cell 154 includes K memory elements.

The present methods aim at programming each multidevice cell (this corresponding to steps S20 to S80 in FIG. 5), one after the other, as reflected by the loop from step S90 to step S10 in FIG. 5. Programming a cell means storing a target weight value in this cell. The target weight value can be converted in an electrical conductance value. So, the aim is to program memory elements of this cell for them to yield a summed conductance value matching a target conductance value corresponding to the target weight value to be stored in that cell. Since weight values are meant to be mapped to conductance values of memory elements, the present methods only apply to analog memory devices, not to digital memory elements.

The target conductance value may for instance be obtained by scaling S60 an initial conductance value, i.e., by multiplying this initial weight value by a scaling factor, where the weight values are typically normalized, i.e., distributed between 0 and 1 (or between −1 and 1, as discussed later). This factor (call it $S_{max}$) can thus be set in accordance with a maximum cell conductance of the cell. The same procedure is applied to each cell. The scaling factor $S_{max}$ accordingly transforms the initial (typically normalized) weight values into suitable conductance units. This scaling factor usually depends on the saturation current of the ADCs used in output of the output lines (not shown). It can further vary across different crossbar arrays and/or output lines of the same crossbar array.

The K memory elements may first have to be initialized (step S20), e.g., by resetting all the K memory elements to a RESET state of zero nominal conductance value. Next, a SET signal is applied to the K memory elements of the cell to set each memory element to a SET state. The true corresponding conductance value is subsequently read out S50, whereby K conductance values are obtained for the K memory elements. The actual conductance values may slightly differ from their nominal values. Note, the same SET signal may possibly be applied to all of the K elements. But even if a same SET signal is applied, the K memory elements will adopt different conductance values.

The actual conductance values of the memory elements in their SET state are subsequently used to optimally program the memory elements of each cell. That is, such conductance values are used, together with the target conductance value, to adjust S70-S80 conductance values of one or more of the K memory elements of the cell. At least one of the K memory elements will normally need to be adjusted, unless their SET conductance values fortunately happen to match the target value or the cell conductance is not able to accommodate the weight value, as discussed later. The memory elements are adjusted by resetting or otherwise altering the conductance of such memory elements. This adjustment S80 effectively amounts to reprogramming one or more of the memory elements. It is performed to match the summed conductance of the K memory elements of the cell with the target conductance value, while maximizing the number of the K memory elements that are either in their SET state or in a RESET state of zero conductance nominal value.

This maximization is subject to that, eventually, at most one of the K memory elements is in an intermediate state, i.e., neither in a SET state nor in a RESET state. So, while several memory elements may come to be reset at step S80, at most one element will be adjusted S80 so as to be neither in a SET nor a RESET state. In other words, the summed conductance of the K memory elements eventually decomposes as a sum of actual conductance values corresponding either to SET and/or RESET states, subject to at most one intermediate conductance value.

The underlying idea is to maximize the number of memory elements that are either in a SET state or a RESET state, because such states are the least noisy states. Again, in the present context, "noisy" means that the actual conductance values may slightly depart from their intended (theoretical) value, whether due to drift or programming inaccuracies. Now, the multiplicity of such states across the crossbar gives rise to noise around ideal values. That said, the SET states of memory elements are usually the least noisy state with regards to the lowest weight noise and drift, while RESET states are effectively nonconductive, such that hence noise and drift have a marginal impact in that case.

Now, in prior programming schemes, the scaling value $G_{max}$ is assumed to be the same for all the memory elements in the array and is defined in such a way that most of the SET conductance values are larger than $G_{max}$. As noted earlier, this makes it impossible to accurately program most of the memory elements to their corresponding SET states. Thus, as the present inventors have realized, programming the memory elements to a SET conductance value $G_{set}$ (instead of $G_{max}$) can lead to significant reduction in programming error and increase the computational precision. So, instead of using a same single scaling value and considering that this value applies to all the memory elements in the array, the present method relies on the actual SET state conductance values of the memory elements in the array to accurately match the target weight values. As per the present approach, at most one memory element per unit cell is in an intermediate (noisy) state, while the rest of them are either in a less noisy SET state or a non-noisy RESET state. As a result, the proposed approach makes it possible to reduce the overall noise, which benefits to the accuracy of computations.

Compared to existing multi-device programming schemes, the present solution has the following advantages. First, as said above, the present approach reduces weight and drift noise as it maximizes the number of memory elements in a SET or RESET state, which are the least noisy states. This maximization is subject to that at most one memory element per cell is in an intermediate state. Second, the proposed approach allows a more optimal weight mapping to be achieved. For example, the present methods may select the smallest number of memory elements needed, a priori, to match a given weight value, by exploiting their true $G_{set}$ value. And this results in less energy and time overhead during the programming because a single round of programming is merely needed after the conductance readout.

Note, the present approach also applies to memory elements in a non-differential configuration. I.e., the multidevice unit cells may have a differential configuration, as in embodiments discussed later in detail. The logic remains the same, except that the memory element to be reprogrammed/reset will belong to a polarity group selected in accordance with the weight value. In general, however, each cell may involve one or two groups of K memory elements each. One group is sufficient where the weight values are normalized and, e.g., distributed between 0 and 1. Relying on two groups of memory elements is useful where the weight values are distributed between, e.g., −1 and 1. In the present context, the minimal number K of elements in a group, whether in a differential or non-differential configuration, is equal to two.

All this is now described in detail, in reference to embodiments of the invention. To start with, various approaches may be contemplated to maximize the number of memory elements in a SET or RESET state. One convenient way, though, is to first determine a suitable subset out of the of the K memory elements of the cell (or in a group of K elements). In detail, the present methods may advantageously seek to determine S70 a subset of K' memory elements, where K'≤K, based on the target conductance value and the K conductance values read at step S50. This subset is determined so that the summed conductance of the K' elements matches the target conductance value with a certain tolerance. Still, this tolerance should be such that it can be removed by suitably reprogramming at most one of the K' memory elements, after the initial programming performed at step S40 to set memory elements to the SET state.

Next, the adjustment step S80 may include resetting any remaining memory element that is not in the determined subset. Such elements, if any, are reset by applying a RESET signal to set them to a RESET state of zero nominal conductance. Resetting any remaining memory element outside the subset is one way to adjust the conductance value of this element. Alternatively, or in addition, one of the K' memory elements may have to be reprogrammed, which also cause to adjust the conductance value of a memory element. The adjustment procedure S80, whether involving reset and/or reprogramming a memory element, is performed so as for the sum of the actual conductance values of all memory elements of the cell to match the target conductance value. Various scenarios can be contemplated. Examples of such scenarios are aggregated in Tables I and II below.

Table I addresses adjustment scenarios for a cell of two memory elements (D1 and D2) arranged in parallel. The top values correspond to conductance values of the devices in the SET state (i.e., after step S40). The conductance values of the elements belonging to the identified subset are underlined. The bottom values, in parentheses, correspond to the adjusted conductance values (as obtained after step S80).

TABLE I

Examples of adjustment scenarios for a cell of two memory elements in parallel

| Scenario # | $G_{target}$ | $G_{D1}$ | $G_{D2}$ | Adjustment solution and remarks |
|---|---|---|---|---|
| 1 | 100 | 100 (100) | 80 (0) | Select D1 and reset D2. The identified subset consists of D1 only, which is maintained in its initial SET state to meet the target conductance value |
| 2 | 90 | 100 (90) | 80 (0) | Select D1, reset D2, and reprogram D1. The identified subset again consists of D1 only, which is reprogrammed for the cell to meet target conductance value |
| 3 | 90 | 100 (10) | 80 (80) | Select D1 and D2, maintain D2 in its SET state and reprogram D1 for the cell to match the target value. The identified subset is not a strict subset of the initial group of two elements. No device is reset in this case |

Table II addresses adjustment scenarios for a cell of three memory elements arranged in parallel. Again, the top values of the devices D1, D2, D3 correspond to conductance values of the devices in the SET state (after step S40), the conductance values of the elements in the identified subset are underlined, and the bottom values (in parentheses) correspond to the adjusted conductance values (after step S80).

TABLE II

Examples of adjustment scenarios for a cell of three memory elements in parallel

| Scenario # | $G_{target}$ | $G_{D1}$ | $G_{D2}$ | $G_{D3}$ | Adjustment solution and remarks |
|---|---|---|---|---|---|
| 4 | 100 | 100 (100) | 90 (0) | 80 (0) | Select D1 and reset both D2 and D3. The identified subset consists of D1 only, which is maintained in its |

TABLE II-continued

Examples of adjustment scenarios for a cell of three memory elements in parallel

| Scenario # | $G_{target}$ | $G_{D1}$ | $G_{D2}$ | $G_{D3}$ | Adjustment solution and remarks |
|---|---|---|---|---|---|
| | | | | | initial SET state, while the other devices are reset to meet the target conductance value |
| 5 | 180 | 100 (<u>100</u>) | 90 (0) | 80 (<u>80</u>) | Select D1 and D3 to form a subset and reset D2. D1 and D3 are maintained in their initial SET state, while D2 is eventually reset to meet the target conductance value |
| 6 | 170 | 100 (0) | 90 (<u>90</u>) | 80 (<u>80</u>) | Select D2 and D3 to form a subset and reset D1. D2 and D3 are maintained in their initial SET state, while D1 is eventually reset to meet the target conductance value |
| 7 | 170 | 100 (<u>100</u>) | 90 (<u>70</u>) | 80 (0) | Select D1 and D2 to form a subset, reset D3, and reprogram D2 to meet the target conductance value |
| 8 | 170 | <u>100</u> (<u>100</u>) | <u>90</u> (0) | 80 (<u>70</u>) | Select D1 and D3 to form a subset, reset D2, and reprogram D3 to meet the target conductance value |

Figure 3B:
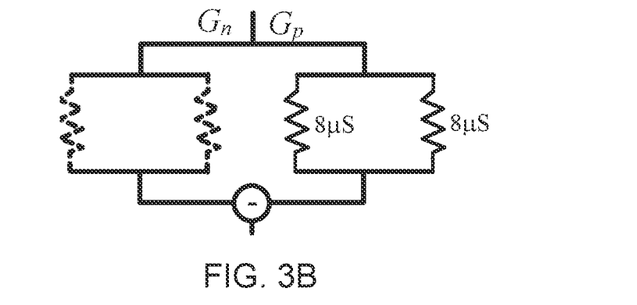
Figure 3C:
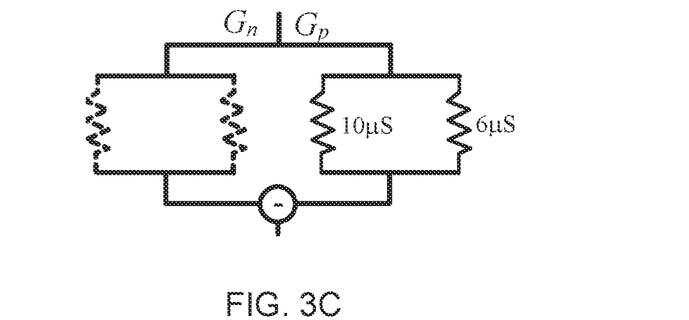
Figure 3D:
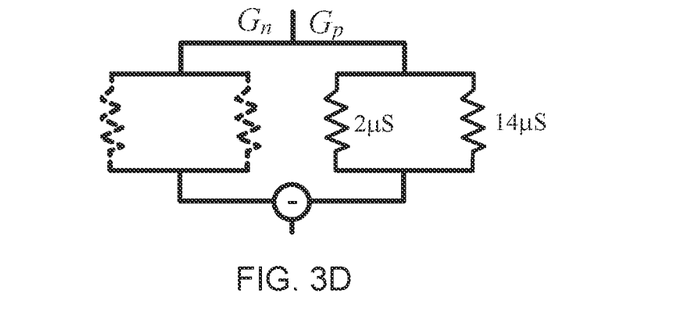

Note, the conductance values indicated in the above tables and in FIGS. 3B-3D are chosen for the sake of illustration only; they do not mean to be realistic.

In the above tables, the cell is assumed to include a single group of memory elements. However, the above scenarios can be straightforwardly extrapolated to a cell including two groups of memory elements in a differential configuration; the adjustment solutions would then apply to a selected polarity group, as explained later in detail.

In each of the above examples, a suitable subset of K' memory element is identified, which subset is sufficient for the cell to store the desired weight value. In practice, this means that the summed conductance of the memory elements of this subset must be larger than or, at least, equal to the conductance value corresponding to the target weight to be stored in this cell. Next, the remaining memory elements (outside the identified subset), if any, are reset to a RESET state of zero nominal conductance value, while at most one memory element is reprogrammed, e.g., using a conventional single-device programming scheme, with a view to bringing the summed conductance values of all the memory elements in the cell as close as possible to the target conductance value.

The subset is preferably determined S70 as a minimal subset, i.e., a smallest possible subset in terms of cardinality, as in all of the scenarios presented in tables I and II but scenario 3, where the selected subset does not have the smallest possible cardinality. In fact, the determined subset is not even a proper (i.e., strict) subset of the initial group in this example as it is equal to the initial group of two memory elements. In that case, no memory element is reset to a RESET state. Rather, the programming strategy used in scenario 3 aims at maximizing the number of memory elements that can be maintained in the SET state.

In all of the other scenarios, the selected subset is a subset having the smallest possible cardinality, i.e., a least-populated subset, consisting of a minimal number of memory elements required to store the target weight. Now, several possible subsets may potentially be identified for a same target conductance value, as in scenarios 6 to 8. Still, the programming method may further discriminate among the possible subsets by selecting those memory elements for which the summed conductance values in the SET state is the largest, as in scenario 7. In this case, the subset is determined so as to meet two conditions, which are: (i) of all the possible subsets of the K memory elements that are able to store the target weight, a priori, the optimal subset is determined as that subset having minimal cardinality; and (ii) of all possible subsets having that same minimal cardinality, the summed conductance values of the memory elements in that subset must be the largest, as in scenario 7, as opposed to scenario 8.

This, in practice, can be achieved by first identifying those memory devices that have the largest conductance values in their SET state and then selecting the minimal number of memory elements required to match the target electrical conductance value, starting from the element of highest conductance value.

The K–K' remaining memory elements of the cell (i.e., not in the determined subset) belong to the absolute complement of the smallest subset identified. In other words, the set formed by the elements of the cell decomposes into two complementary subsets: the smallest subset identified, and the complement formed by the remaining memory elements. The K–K' remaining elements are reset by applying S80 a RESET signal, which results in placing such elements in a RESET state of zero nominal conductance value, as in scenarios 1, 2, and 4 to 8. Doing so increases the number of elements that eventually rest in a RESET state, which reduces the noise across memory elements of the array.

In addition to resetting outsiders, it will often be necessary to reprogram exactly one of the K' memory elements of the determined subset, for the cell to meet the target conductance. That is, the adjustment procedure S80 mostly require reprogramming exactly one memory elements, such that this element is neither in a SET or a RESET state, eventually, as in scenarios 2, 3, 7, and 8. Doing so limits the number of devices in an intermediate state to at most one device per cell, which limits the noise.

In some cases, it is sufficient to reset memory elements outside the determined subset, without having to reprogram any memory element, should the summed conductance value fortunately match the target value, as in scenarios 1, 4, 5, and 6. Such situations, however, are rather unlikely in practice. Rather, it will mostly be necessary to both reset the remaining memory elements and reprogram exactly one of the K' memory elements.

As illustrated above, steps S70-S80 may, in general, be performed so as to favor memory elements that are either in a SET state or in a RESET state. Some strategies may favor RESET states over SET states or, conversely, SET states over RESET states, to a certain extent. Which strategy is the best depends on the memory element characteristics and, in fact, the system 1 as a whole, also considering peripheral circuits. Strategies favoring the RESET states are desired where memory elements of lower SET states also have lower noise. Where the memory elements that have a larger SET state happen to have lower noise, then it may be better to strive to keep as many elements as possible in the SET state, reset the others, and reprogram at most one memory element to meet the target conductance value.

The memory element to be reprogrammed can be selected by default. It may also be randomly selected from the subset of K' elements. Much preferred, however, is to select this element as the element of the subset that has the lowest possible electrical conductance, as in scenarios 7 and 8. As explained above, this lead to minimize the noise in the intermediate range.

Any suitable single-device programming method can be used, whether to set, reset, or reprogram the memory elements. Examples of such methods include iterative programming (ITP) methods, gradient-based programming (GDP) algorithms, and single shot programming (SSP) methods. The ITP and SSP methods are discussed in the background section. Examples of use of an ITP method and a gradient-based algorithm are discussed in section 2, in reference to FIGS. 6A and 6B.

Single-device programming methods can also be used to set and reset the memory elements. Preferably, the K memory elements 157 are initially set S40 to their SET state by programming them according to the SSP method. The same method can also be used to reset S80 the remaining memory elements. A mix of ITP and SSP methods can also be used, as noted in the background section. In all cases, the summed conductance values of the memory elements of the cell must eventually match the target conductance value, as closely as possible.

As said, the present approach extends to multidevice cells including two groups of memory elements in a differential configuration. As illustrated in FIGS. 3A-4E, each cell 154 includes a respective memory system 156, itself decomposing into two groups 156p, 156n of K memory elements 157 each (again, K≥2 in each group). So, each cell 154 now includes 2 K memory elements, arranged in parallel in the two groups, i.e., a first group 156p of K memory elements and a second group 156n of K memory elements, respectively meant to store a positive weight value and a negative weight value. Since the two groups 156p, 156n are arranged in a differential configuration, any weight value (whether positive or negative) can be read by reading the summed conductance values of the parallel memory elements 157.

The core principles discussed earlier in reference to a single group of memory elements remain unchanged. However, a given group must now be selected S30 (see FIG. 5) in accordance with an intended sign of the target weight to be stored in each cell. I.e., positive and negative weight values will be stored in the group of corresponding polarity. Next, the SET signal need only be applied S40 to the K memory elements of the selected group, which results in setting each of the K memory elements of the selected group to a SET state. Notwithstanding, all conductance values are being read at step S50, it being reminded that all memory elements 157 will normally have suitably been initialized (e.g., reset) at step S20, prior to setting S40 the selected memory elements to a SET state. So, 2 K conductance values are read at step S50, i.e., the K conductance values of the K memory elements of each of the two groups. The reason for doing so is that all conductance values should preferably be taken into account to finally adjust S80 the summed conductance. That being said, it may also be sufficient to read the K conductance values of the sole elements set to a SET state, since the other elements can be assumed to have zero conductance.

As before, the following steps S70-S80 are performed to adjust a conductance value of at least one of the K memory elements of the selected group, based on the 2 K conductance values read and the target conductance value. Again, the aim is to match the summed conductance of the 2 K memory elements with the target conductance value, it being noted that the actual conductance values of the K memory elements of the other (i.e., not selected) group will be equal to or very close to zero. Consistently with principles discussed earlier, steps S70-S80 are performed so as to maximize the number of the 2 K memory elements that are either in a SET state or in a RESET state of zero conductance nominal value, although one of the K memory elements of the selected polarity group may have to be set to an intermediate state (i.e., neither in a SET state nor in a RESET state).

In other words, only the memory elements of the selected group are being set S40 and possibly reprogrammed S80. The RESET signals applied at step S80 may only concern memory elements of the selected group. In variants, RESET signals can also be applied to memory elements of the other group too, depending on the initialization protocol used.

Again, the method may advantageously seek to determine a subset of K' elements, albeit within the selected polarity group only. This subset can be determined so as to verify: $|\Sigma_i^{\{S\}} G_i^p - \Sigma_{i=1}^K G_i^n| \geq |G_{target}|$ if the target weight value is positive, or $|\Sigma_{i=1}^K G_i^p - \Sigma_i^{\{S\}} G_i^n| \geq |G_{target}|$, if the target weight value is negative.

In the above equations, $\{S\}$ denotes the determined subset, $G_i^p$ is the conductance value of an i-th memory element of the first group 156p, $G_i^n$ stands for the conductance value of an i-th memory element of the second group 156n, and $G_{target}$ is the target conductance value. However, the values $G_i^{n/p}$ refer to read conductance values of memory elements that may either be in a SET state or in a RESET state, depending on the sign of the target weight and the group of memory elements meant to store the weight value.

Additional features of the present methods are described in Section 2.

Referring back to FIG. 1, another aspect of the invention is now described in detail, which concerns a processing system 1. The system notably includes an IMC device 15 having a crossbar array structure, as described earlier in reference to the present methods. The memory elements 157 are analog memory devices, which can notably be phase-change memory (PCM) devices, resistive random-access memory (RRAM) devices, or flash memory cell devices. Using such devices, a weight value is mapped over a conductance range of a memory element, as opposed to multiple binary devices representing different weight bits in digital storage. Preferred embodiments rely on PCM devices.

In addition to the IMC device 15, the system 1 includes a programming unit 19, which is connected to the IMC device 15. The programming unit 19 may notably be connected to input lines 151 of the IMC device 15. The programming unit 19, however, is normally independent from the input unit 11, which is used to apply signals to the input lines 151, to operate the IMC device 15. The programming unit 19 is generally configured to program each cell 154 of the device 15 in accordance with principles described above in reference to the present methods. In particular, the programming unit 19 is designed so as to be able to set, reset, and adjust conductance values of memory elements of each cell 154, as necessary to match a summed conductance of the memory elements of each cell with a target conductance value. Consistently with the present methods, the programming unit 19 will do so by maximizing a number of the memory elements that are either in a SET state or in a RESET state (of zero conductance nominal value), under the constraint that at most one memory elements is neither in a SET state nor in a RESET state.

For instance, the unit 19 may be adapted to adjust conductance values of the memory elements 157 by applying suitable voltage signals across the input lines or the output lines, respectively 151 of the IMC device 15. In variants, the programming unit 19 may connect to the memory elements via independent connectors. Note, the processing system 1 typically includes a readout circuit 16 connected in output of the output lines 152. The programming unit 19 may thus be connected to the readout circuit 16, in output thereof, so as to be able to adjust conductance values of the memory elements 157 in accordance with a single-device programming method, as evoked above. Moreover, the system 1 may further include a processing unit 18, connected in output of the IMC device 15 i.e., in output of the readout circuitry 16. This processing unit 18 is preferably arranged as a near-memory processing unit. In that case, the programming unit 19 may advantageously be connected in output of the near-memory processing unit 18, to allow a closed-loop programming of the crossbar array structure 15. In variants, the processing unit 18 and the programming unit 19 are implemented as one and a same unit. The programming unit 19 may further include an input/output (I/O) controller and be configured to communicate with external devices or computers, as suggested in FIG. 1.

The memory system 156 of each cell 154 of the IMC device 15 preferably include two groups 156$p$, 156$n$ of K memory elements 157, where the two groups 156$p$, 156$n$ are in a differential configuration, for reasons explained earlier. In that case, the programming unit 19 must further be able to select a given group in accordance with the sign of the target weight to be stored in each cell 154.

Once the weights have been programmed across the crossbar array 15, vector components can be injected into the crossbar array structure 15. More precisely, signals encoding a vector of N components (i.e., an N-vector) can be applied to the N input lines 151 of the crossbar array structure 15, via the input unit 11, e.g., to cause the crossbar array structure 15 to perform multiply-accumulate (MAC) operations based on the N-vector and the N×M weights stored in the device 15. The MAC operations result in that the values encoded by the signals fed into the N input lines are respectively multiplied by the weight values.

Such MAC operations can be instance be performed as part of executing or training an ANN. A single crossbar array structure can typically implement one neural layer at a time. Still, the crossbar array structure 15 can be cyclically operated, in a closed loop, so as for the structure 15 to implement several successive, connected neural layers of the ANN, provided that the neural weights can be efficiently and accurately reprogrammed at each algorithmic cycle. In variants, several crossbar array structures 15 are cascaded, to achieve the same. The neural layer implemented by a crossbar array structure 15 can be any layer of the ANN or a portion of this layer.

The optimal mapping of operations, whether directed to ANN applications or not, can be determined by the processing unit 18 or an external processing unit (not shown), i.e., a unit distinct from the core compute array 15. However, the processing unit is preferably co-integrated with the core IMC array 15 in the system 1, as assumed in FIG. 1. In all cases, a processing unit can be used to determine a computation strategy (i.e., input vectors and block matrices, and associate them). The corresponding matrix weight values can then be passed to the programming unit 19 for it to suitably program the cells of the array 15. In practice, the programming unit 19 may include a programming controller. Like the input unit, the programming unit may include, or be connected to, a signal generator to apply pulses in accordance with the programming controller.

The system 1 shown in FIG. 1 includes several devices (i.e., an IMC device 15, a readout circuitry 16, a near-memory processing unit 18, and a programming unit 19), which are connected to each other to form the system 1. The system 1 itself can be fabricated as a single apparatus or, even, a single device. In particular, the IMC device 15, the processing unit 18, and the programming unit 19, may all be co-integrated in a same chip, as assumed in FIG. 1. The system 1 may thus consist of a single device (e.g., a single chip), co-integrating all the required components. Thus, the present systems 1 may conveniently be used in a special-purpose infrastructure or network, e.g., to serve multiple, concurrent client requests. The overall system may for instance be configured as a composable disaggregated infrastructure, which may further include other hardware acceleration devices, e.g., application-specific integrated circuits (ASICs) and/or field-programmable gate arrays (FPGAs).

Next, according to another aspect, the invention can be embodied as a computer program product for programming memory elements 157 of an IMC device 15 as described earlier. The computer program product comprises a computer readable storage medium having program instructions embodied therewith, where the program instructions are executable by processing means of a programming unit 19, which can be connected to the IMC device 15, to cause the programming unit 19 to program each cell 154, following principles described in reference to the present methods. Section 3 provides further details.

The above embodiments have been succinctly described in reference to the accompanying drawings and may accommodate a number of variants. Several combinations of the above features may be contemplated. Examples are given in the next section.

2. Particularly Preferred Embodiments 2.1 Preferred Flow (FIG. 5)

FIG. 5 shows a preferred (high-level) flow of steps of a method of programming memory elements 157 of an IMC device 15. The process starts at step S5. It iterates over cells 154 of the IMC device 15. A next cell is selected at step S10. Memory elements are initialized at step S20, e.g., by applying a RESET signal to all memory elements of the currently selected cell, though cells may also be initialized all at once prior to selecting S10 a new cell. At step S30, a given polarity group is selected in accordance with the sign of the target weight value to be stored in that cell. The value of the target weight is used as input to step S30. A SET signal is applied to all memory elements of the selected polarity group at step S40, prior to reading conductance values of the memory elements of the cell at step S50. Next, a sufficient subset (e.g., a minimal subset) is determined at step S70, based on the read conductance values and the target conductance value corresponding to the target weight value. Note, the target conductance value is typically obtained S60 by suitably scaling the target weight value, as explained in Section 1. Once a suitable subset has been determined S70, one memory element is selected for intermediate programming, if necessary. This element is preferably selected as the subset element that has the lowest conductance. The conductance of one or more memory elements is subsequently adjusted S80, as necessary to match the summed conductance of the memory elements of the cell with the target conductance value. There, memory elements that are outside the determined subset are reset. In addition, at most one of memory elements of the subset is set to an intermediate state (neither a SET state nor a RESET state), so as to maximize the number of memory elements that are either in a SET state or in a RESET state. If the current cell is the last cell (S90: Yes), the programming process stops at step S100. Else (S90: No), the process moves on to the next cell S10. The process repeats until all cells are suitably programmed.

2.2 Preferred Cell Architecture and Illustrative Examples (FIGS. 3A-3D)

FIG. 3A shows a preferred cell architecture, where the respective memory system 156 includes two groups 156p, 156n of K memory elements 157 numbered 1 to K (K≥2), such that the cell includes 2 K memory elements. The two groups 156p, 156n are in a differential configuration. The first group 156p is meant to store a positive weight value, while the second group 156n is meant to store a negative weight value. In each group, the K memory elements 157 are arranged in parallel. The parallel and differential configuration allows all conductance values to be read in one step. The resulting conductance is equal to the sum of the conductance values of elements 157 of the first group minus the sum of the conductance values of elements of the second group, which yields the desired weight value.

FIGS. 3B, 3C, and 3D, compare different programming approaches, assuming that the cell is composed of four resistive elements 157, with two memory elements per polarity group. Assume that the weight value (w) to be stored in the cell is equal to 0.8, while the SET values of the two memory elements of the positive polarity group are respectively equal to $G_{SET,D1}$=12 µS and $G_{SET,D2}$=14 µS. Assume further that a suitable scaling factor $S_{max}$ is equal to 20 µS, this corresponding to a value $G_{max}$=10 µS (because K=2).

The equal-fill approach (FIG. 3B) copies the conductance value w×$G_{max}$=8 µS to all the memory elements, which requires iteratively programming all the devices of the selected group to an intermediate state, this resulting in "noisy" values. The max-fill approach (FIG. 3C) sets a device to $G_{max}$=10 µS and then programs the remaining device to the residual value (6 µS), which has a similar drawback. I.e., both memory elements are iteratively programmed to an intermediate state. On the contrary, the present approach (FIG. 3D) initially sets all memory element to a SET state and then iteratively programs the element D1 (of lowest SET conductance) for it to reach a lower residual conductance value (2 µS). This reduces the noise compared to the equal-fill and max-fill approaches, because the SET state is less noisy than the w×$G_{max}$ state and the $G_{max}$ state. Note, the benefit of this approach increases as the number of memory elements per cell increases (K>2), because at most one memory element is in an intermediate state, while all remaining elements are either in a SET or RESET state.

2.3 Examples of Step-by-Step Programming (FIGS. 4A-4E)

Figure 4A:
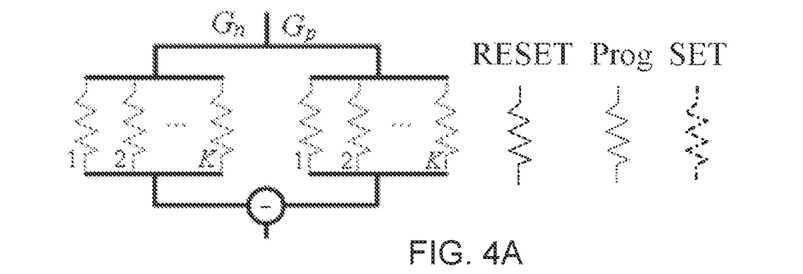
FIGS. 4A-4E illustrate, step by step, the programming of memory elements of a unit cell such as depicted in FIG. 3B, as in embodiments.
Figure 4B:
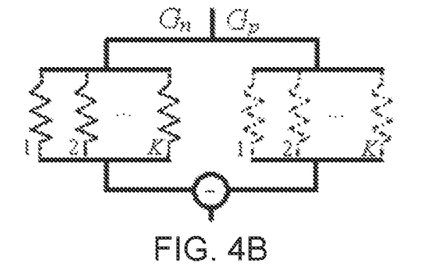
Figure 4C:
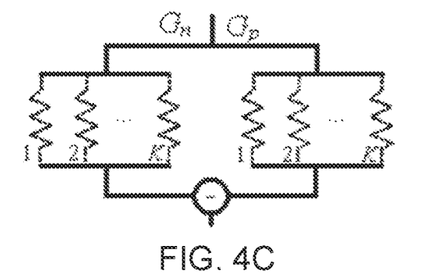
Figure 4D:
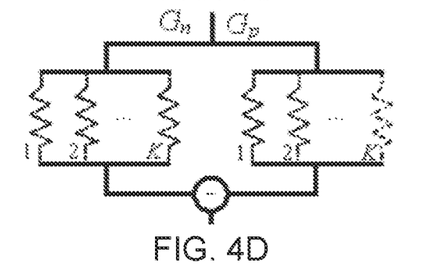
Figure 4E:
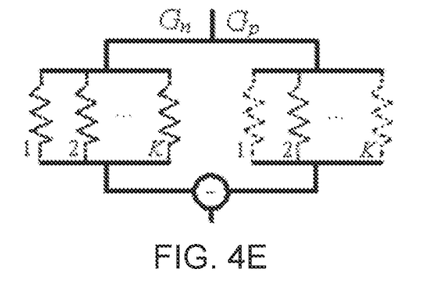

FIG. 4A-4E illustrates, step by step, the programming of a cell according to an embodiment aiming at maximizing the number of memory elements in a SET state. First, a suitable scaling factor $S_{max}$ is chosen, which transforms the normalized weight values to corresponding conductance values (in conductance units). This step corresponds to step S60 in FIG. 5. The factor $S_{max}$ depends on the saturation current of the ADC circuitry in output of the IMC tile 15. It can further vary across different IMC tiles and/or output lines of the same tile. Second, the array is initialized (step S20 in FIG. 5) by resetting all the memory elements devices. FIG. 4A depicts the cell as obtained after this step. Third, all the memory elements of the positive polarity group (i.e., corresponding to the polarity of the positive weight value to be programmed) are set to a SET state, see FIG. 4B. Fourth, the conductance values of the memory elements are read.

A first scenario in one in which $|\Sigma_{i=1}^{K} G_i^p - \Sigma_{i=1}^{K} G_i^n| \geq |G_{target}|$. That is, the total conductance of the cell is insufficient to support the weight value. In that case, the memory element is left as is, i.e., all the memory elements corresponding to the weight's polarity are left in their SET state.

In a second (more likely) scenario, the cell can support the weight value to be programmed, i.e., $|\Sigma_i^K G_i^p - \Sigma_{i=1}^{K} G_i^n| \geq |G_{target}|$. So, a mapping can be decided by the following process:

(i) Find the least populated set {S} of memory elements such that $|\Sigma_i^{\{S\}} G_i^p - \Sigma_{i=1}^{K} G_i^n| \geq |G_{target}|$ for a positive weight value or $|\Sigma_i^K G_i^p - \Sigma_i^{\{S\}} G_i^n| \geq |G_{target}|$ for a negative weight value;

(ii) Reset all the memory elements that are not in the set {S}; and (iii) Select the least conductive memory element of the set {S} for further programming. I.e., this memory element is further programmed in a following step, so as for the cell to reach the value $G_{target}$, using any suitable single-device programming scheme.

Several cases can be delineated. For example, FIG. 4C, it may be sufficient to adjust a single memory element (e.g., element 2) for the cell to match the target conductance value once all other memory elements have been reset (step S80 in FIG. 5). Another example, FIG. 4D, concerns the case where the minimal subset required to meet the target conductance value, a priori, consist of elements 2 to K. Still, the conductance of the memory element of smallest SET conductance (element 2 in this example) need be adjusted, while the other elements of the subset can be left to their SET state. Note, element 1 is reset as it does not belong to the determined subset. The last case, FIG. 4E, addresses a scenario in which all memory elements of the positive polarity group need be selected; the determined subset is not a strict subset of the relevant polarity group. In this case, all elements of the positive polarity group are left in their SET state, subject to element 2, which is reprogrammed to an intermediate state.

Various single-device programming methods can be used to adjust the single element identified for further programming, such as the iterative programming (ITP) scheme, single shot programming (SSP) scheme on intermediate values, and gradient-based (GDP) algorithms. Suitable implementations of the ITP and GDP schemes are described in the next subsection.

Figure 6A:
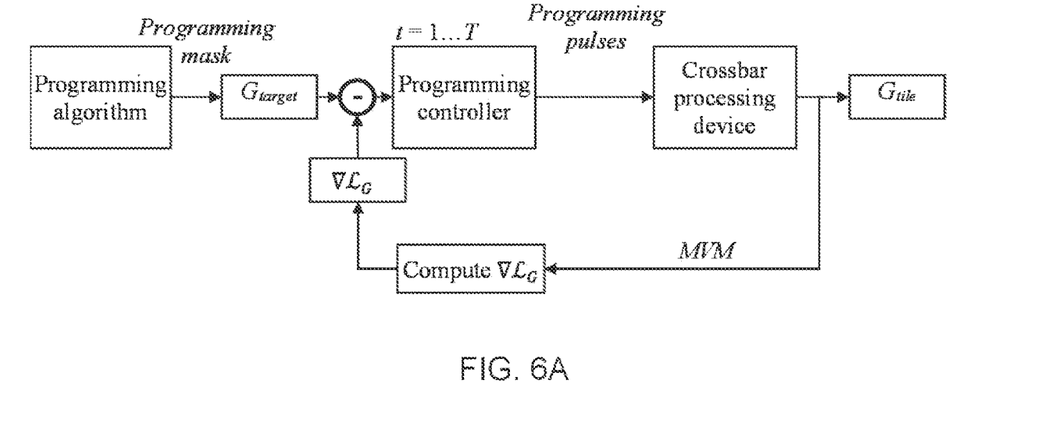
Figure 6B:
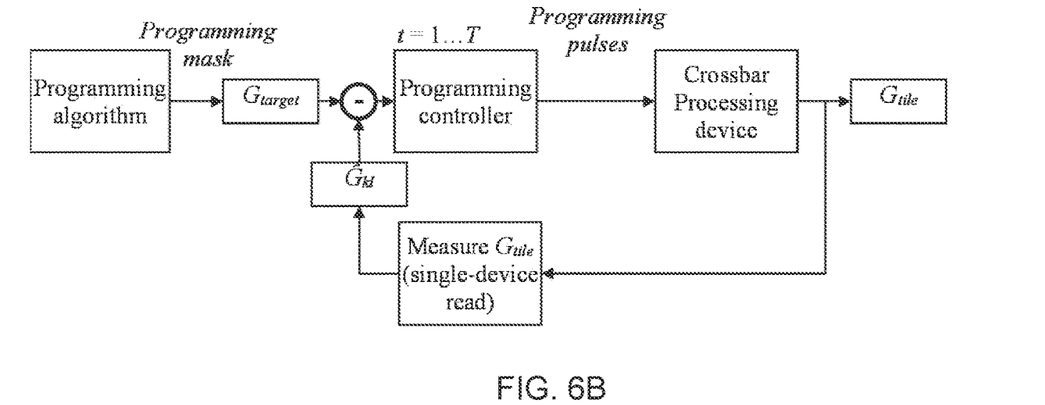

2.4 Examples of Single-Device Programming Methods (FIGS. 6A, 6B)

FIG. 6A illustrates a gradient descent-based (GDP) algorithm used to further program a single memory element selected for further programming. The programming algorithm (implemented by the programming unit 19) provides a programming mask to further program the single memory element selected; the aim is for the cell to meet the target conductance value $G_{target}$ by solely reprogramming the selected element, given that other memory elements will either stay in a SET state or be reset to a RESET state. Following this procedure, the GDP algorithm is run, which may give rise to several iterations (t=1 ... T). A programming controller causes to apply pulses to the IMC tile 15 in accordance with the programming mask. The GDP algorithm iteratively computes the gradient of a loss function L that captures the quality of the matrix-vector multiplication (MVM). The gradient is converted to pulse amplitudes. Pulses with the obtained amplitudes are then applied to the devices marked by the previously obtained programming mask. The process repeats until a satisfactory loss, i.e., MVM quality, is achieved or the maximum number of iterations is reached.

FIG. 6B illustrates an ITP scheme employed to further program the single memory element selected for further programming. Again, the programming algorithm provides the programming mask to further program the single memory element. Begin the iterative programming loop, which may again require several programming iterations (t=1 ... 7). This loop seeks to minimize the distance between $G_{target}$ and $\hat{G}_{kl}$, measured via single device read method and calculated on the relevant unit cell (k, l), using the measured conductance of all the K devices of each polarity. The programming pulses are calculated by the programming controller and applied to the sole element specified by the programming mask forwarded by the main programming algorithm.

3. Technical Implementation Details

Computerized devices can be suitably designed for implementing embodiments of the present invention as described herein. In that respect, it can be appreciated that the methods described herein are largely non-interactive and automated. The methods described herein can be implemented using software (e.g., firmware), hardware, or a combination thereof. In exemplary embodiments, the methods described herein are implemented using software, as an executable program, the latter executed by suitable digital processing devices. More generally, embodiments of the present invention can be implemented wherein general-purpose digital computers, such as personal computers, workstations, etc., are used. Preferred, however, is to rely on a programming unit 19 (and possibly on a processing unit 18), which are co-integrated with the IMC device 15.

For example, when the programing unit 19 is in operation, a processor thereof is configured to execute software (or mere instructions) stored within a memory of the unit 19, to communicate data to and from the memory, and to generally control operations of the unit 19 pursuant to the instructions or software. The methods described herein, in whole or in part are read by the processor, typically buffered within the processor, and then executed. When the methods described herein are implemented in software, the methods can be stored on any computer readable medium, such as a storage, for use by or in connection with any computer related system or method.

The present invention may thus be a system, a method, and/or a computer program product at any possible technical detail level of integration. The computer program product may include a computer readable storage medium (or media) having computer readable program instructions thereon for causing a processor to carry out aspects of the present invention. The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing.

A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the C programming language or similar programming languages.

While the present invention has been described with reference to a limited number of embodiments, variants, and the accompanying drawings, it will be understood by those skilled in the art that various changes may be made, and equivalents may be substituted without departing from the scope of the present invention. In particular, a feature (device-like or method-like) recited in a given embodiment, variant or shown in a drawing may be combined with or replace another feature in another embodiment, variant, or drawing, without departing from the scope of the present invention. Various combinations of the features described in respect of any of the above embodiments or variants may accordingly be contemplated, that remain within the scope of the appended claims. In addition, many minor modifications may be made to adapt a particular situation or material to the teachings of the present invention without departing from its scope. Therefore, it is intended that the present invention is not limited to the particular embodiments disclosed, but that the present invention will include all embodiments falling within the scope of the appended claims. In addition, many other variants than explicitly touched above can be contemplated. For example, other types of memory elements can be contemplated.

What is claimed is:

1. A method of programming memory elements of an in-memory computing device that has a crossbar array structure including N input lines and M output lines interconnected at cross-points defining N×M cells, where N≥2 and M≥2, wherein the cross-points comprise respective memory systems, each including a group of K memory elements arranged in parallel, where K≥2, whereby each cell of the N×M cells includes K memory elements, and wherein the method comprises programming said each cell, given a target conductance value corresponding to a target weight value to be stored in said each cell, the method comprising:

applying a SET signal to the K memory elements of said each cell to set each of the K memory elements to a SET state and reading K conductance values of the K memory elements in the SET state; and adjusting, based on the K conductance values read and the target conductance value, a conductance value of at least one of the K memory elements to:
- match a summed conductance of the K memory elements of said each cell with the target conductance value, and
- maximize a number of the K memory elements that are either in their SET state or in a RESET state of zero conductance nominal value, such that at most one of the K memory elements is neither in a SET state nor in a RESET state.

2. The method of claim 1, wherein adjusting the conductance value of said at least one of the K memory elements further comprises:
- determining, based on the K conductance values read and the target conductance value, a subset of K' memory elements, a summed conductance of which matches the target conductance value with a tolerance that can be removed by reprogramming at most one of the K' memory elements, where K'≤K; and
- applying a RESET signal to any remaining memory element of said each cell that is not in the subset to set said any remaining memory element to its RESET state.

3. The method of claim 2, wherein adjusting said conductance value includes reprogramming exactly one of the K' memory elements of said subset.

4. The method of claim 2, wherein adjusting said conductance value includes applying the RESET signal to said any remaining memory element.

5. The method of claim 2, wherein adjusting the conductance value of at least one of the K memory elements further comprises:
- adjusting conductance values of at least two of the K memory elements of said each cell by:
  - applying the RESET signal to said any remaining memory element, and
  - reprogramming exactly one of the K' memory elements of said subset.

6. The method of claim 5, the method further comprising:
- identifying one of the K' memory elements as a memory element that has the smallest conductance among the memory elements of the determined subset.

7. The method according to claim 2, wherein the subset is determined as a subset of smallest cardinality, for which the summed conductance values of the memory elements in their SET state is the largest.

8. The method of claim 1, wherein the method further comprises, prior to adjusting said conductance value:
- scaling an initial conductance value to the target conductance value by multiplying an initial weight value by a scaling factor, the latter determined in accordance with a maximum cell conductance of said each cell.

9. The method of claim 1, wherein each of the respective memory systems includes two groups of K memory elements, where K≥2, such that each cell of the N×M cells includes 2 K memory elements, the two groups are in a differential configuration, the two groups consisting of a first group of K memory elements and a second group of K memory elements, which are respectively meant to store a positive weight value and a negative weight value, the K memory elements are in parallel in each of the two groups, and the method further comprises, prior to applying the SET signal:
- selecting a given group of the two groups in accordance with an intended sign of the target weight to be stored in said cell, whereby the SET signal is only applied to the K memory elements of said given group to set each of the K memory elements of said given group to the SET state;
- reading 2 K conductance values, these consisting of K conductance values of the K memory elements in each of the two groups; and
- adjusting a conductance value of at least one of the K memory elements of the given group, based on the 2 K conductance values read and the target conductance value, to match a summed conductance of the 2 K memory elements of said each cell with the target conductance value, and maximize a number of the 2 K memory elements of said each cell that are either in their SET state or in a RESET state of zero conductance nominal value, such that at most one of the K memory elements of the given group is neither in a SET state nor in a RESET state.

10. The method of claim 1, wherein the conductance of the at most one of the memory elements is adjusted in accordance with one of: an iterative programming method; a gradient-based algorithm; or a single shot programming method.

11. The method of claim 1, wherein the K memory elements are set to the SET state by programming the K memory elements according to a single shot programming method.

12. The method of claim 1, wherein said any remaining memory element is reset to the RESET state by programming the remaining memory elements according to a single shot programming method.

13. The method of claim 1, wherein, prior to applying said SET signal, the K memory elements are initialized by resetting all the K memory elements.

14. A processing system for programming memory elements of an in-memory computing device that has a crossbar array structure including N input lines and M output lines interconnected at cross-points defining N×M cells, where N≥2 and M≥2, wherein the cross-points comprise respective memory systems, each including a group of K memory elements arranged in parallel, where K≥2, whereby each cell of the N×M cells includes K memory elements, and wherein the processing system comprises a programming unit connected to the in-memory computing device, the programming unit configured to program each cell, given a target conductance value corresponding to a target weight value to be stored in said each cell, by causing the processing system to:
- apply a SET signal to the K memory elements of said each cell to set each of the K memory elements to a SET state and reading K conductance values of the K memory elements in the SET state; and
- adjust, based on the K conductance values read and the target conductance value, a conductance value of at least one of the K memory elements to:
  - match a summed conductance of the K memory elements of said each cell with the target conductance value, and
  - maximize a number of the K memory elements that are either in their SET state or in a RESET state of zero conductance nominal value, such that at most one of the K memory elements is neither in a SET state nor in a RESET state.

15. The processing system according to claim 14, wherein the programming unit is connected to the in-memory computing device, via the input lines or the output lines of the in-memory computing device, and adapted to adjust the conductance value of said at least one of the K memory elements by applying voltage signals across the input lines or the output lines, respectively.

16. The processing system according to claim 14, wherein the processing system further includes a readout circuit connected in output of the output lines, the programming unit is further connected to the readout circuit, and programming unit is configured to adjust said conductance value in accordance with a single-device programming method.

17. The processing system according to claim 16 wherein each of the respective memory systems includes two groups of K memory elements, where K≥2, such that each cell of the N×M cells includes 2 K memory elements, the two groups are in a differential configuration, the two groups consisting of a first group of K memory elements and a second group of K memory elements, which are respectively meant to store a positive weight value and a negative weight value, the K memory elements are in parallel in each of the two groups, and the programming unit is further configured to select a given group of the two groups in accordance with an intended sign of the target weight to be stored in said cell.

18. The processing system of claim 14, wherein the memory elements are one of phase-change memory devices, resistive random-access memory devices, and flash memory cell devices.

19. The processing system of claim 18, wherein the memory elements are phase-change memory devices.

20. A computer program product for programming memory elements of an in-memory computing device, which has a crossbar array structure including N input lines and M output lines interconnected at cross-points defining N×M cells, where N≥2 and M≥2, wherein the cross-points include respective memory systems, each including a group of K memory elements arranged in parallel, where K≥2, whereby each cell of the N×M cells includes K memory elements, the computer program product comprising a computer readable storage medium having program instructions embodied therewith, the program instructions executable by processing means of a programming unit connectable to the in-memory computing device, to cause the programming unit to program said each cell, given a target conductance value corresponding to a target weight value to be stored in said each cell, by:
  applying a SET signal to the K memory elements of said each cell to set each of the K memory elements to a SET state and reading K conductance values of the K memory elements in the SET state; and
  adjusting, based on the K conductance values read and the target conductance value, a conductance value of at least one of the K memory elements to:
    match a summed conductance of the K memory elements of said each cell with the target conductance value, and
    maximize a number of the K memory elements that are either in their SET state or in a RESET state of zero conductance nominal value, such that at most one of the K memory elements is neither in a SET state nor in a RESET state.

21. The computer program product of claim 20, wherein the program instructions are designed so that adjusting the conductance value of said at least one of the K memory elements causes to:
  determine, based on the K conductance values read and the target conductance value, a subset of K' memory elements, a summed conductance of which matches the target conductance value with a tolerance that can be removed by reprogramming at most one of the K' memory elements, where K'≤K; and
  perform one or each of:
    applying a RESET signal to any remaining memory element of said each cell that is not in the subset to set said any remaining memory element to its RESET state, and
    reprogramming at most one of the K' memory elements of said subset.

22. The computer program product of claim 21, wherein the program instructions to adjust the conductance value of said at least one of the K memory elements includes reprogramming exactly one of the K' memory elements of said subset.

23. The computer program product of claim 21, wherein the program instructions to adjust said conductance value includes applying the RESET signal to said any remaining memory element.

24. The computer program product of claim 21, wherein the program instructions to adjust the conductance value of at least one of the K memory elements comprises: adjusting conductance values of at least two of the K memory elements of said each cell by applying the RESET signal to said any remaining memory element, and reprogramming exactly one of the K' memory elements of said subset.

25. The computer program product of claim 24, wherein the program instructions further comprise:
  identifying said exactly one of the K' memory elements as a memory element that has the smallest conductance among the memory elements of the determined subset.

* * * * *